(12) United States Patent
Sele et al.

(10) Patent No.: US 8,603,922 B2
(45) Date of Patent: Dec. 10, 2013

(54) SEMICONDUCTOR DEVICE, DISPLAY, ELECTRONIC APPARATUS AND METHOD OF MANUFACTURING A SEMICONDUCTOR DEVICE

(75) Inventors: Christoph Wilhelm Sele, London (GB); Nicolaas Aldegonda Jan Maria van Aerle, Eindhoven (NL); Eduard Jacobus Antonius Lassauw, Eindhoven (NL)

(73) Assignee: Creator Technology B.V., Breda (NL)

( * ) Notice: Subject to any disclaimer, the term of this patent is extended or adjusted under 35 U.S.C. 154(b) by 0 days.

(21) Appl. No.: 12/694,969

(22) Filed: Jan. 27, 2010

(65) Prior Publication Data

US 2011/0180816 A1 Jul. 28, 2011

(51) Int. Cl.
*H01L 21/31* (2006.01)

(52) U.S. Cl.
USPC ....... 438/780; 438/99; 438/781; 257/E33.002

(58) Field of Classification Search
USPC ........................................... 438/99, 780, 781
See application file for complete search history.

(56) References Cited

U.S. PATENT DOCUMENTS

2006/0169490 A1* 8/2006 Bolken et al. ................ 174/521
2008/0135836 A1* 6/2008 Gelinck et al. ................ 257/40
2009/0115318 A1* 5/2009 Gregory et al. ............... 313/504

FOREIGN PATENT DOCUMENTS

WO    WO 2006/051457 A1    5/2006

* cited by examiner

*Primary Examiner* — Alexander Ghyka (57) ABSTRACT

A method is described for manufacturing a semiconductor device that comprises the steps of providing on a substrate a layer of a conducting material in a pattern comprising isolated elements having a first set of edges. The method further includes providing, on the substrate, a series of wall structures for forming one or more cavities there between. The wall structures have a second set of edges cooperating with the first set of edges. The second set of edges is positioned outside the first set of edges by a pre-defined distance. The method furthermore includes depositing a liquid material in the cavities. A display and an electronic apparatus incorporating the above described features is also disclosed.

11 Claims, 9 Drawing Sheets

SEMICONDUCTOR DEVICE, DISPLAY, ELECTRONIC APPARATUS AND METHOD OF MANUFACTURING A SEMICONDUCTOR DEVICE

FIELD OF THE INVENTION

The invention relates to a method of manufacturing a semiconductor device. The invention further relates to a semiconductor device, a display and an electronic apparatus comprising the same.

BACKGROUND OF THE INVENTION

A method for manufacturing a semiconductor device is known from WO2006/051457 A1. The known method comprises arranging a series of wall structures on a surface of a suitable substrate provided with portions of a patterned metal layer. The wall structures, which may be manufactured from a resist material define a series of barriers and cavities which serve to guide subsequently printed materials. For example, a suitable liquid material conceived to form a semiconductor region may be provided in these cavities. In the known method respective shapes of the cavities are constructed to maintain registration between layers of a device structure. In particular, the known method provides for self-aligned layers of the semiconductor device.

SUMMARY OF THE INVENTION

It is a disadvantage of the known method that surface inhomogeneities or precipitations from a suitable solution or dispersion on the substrate can cause the liquid-solid contact line of a drying fluid drop to become pinned, i.e. to become fixed at a certain position on the substrate. In this case, relatively faster evaporation may result in material transport to the drop perimeter. This may manifest itself in a ring-like deposit of a solute after complete drying of a solution or dispersion. This effect may be particularly pronounced when a semiconductor area is defined by solution deposition on pre-patterned surfaces, e.g. inkjet printing of a semiconductor solution into well-like surface features.

In view of the above, a method is described herein for manufacturing a semiconductor device. The method includes providing, on a substrate, a layer of a conducting material in a pattern comprising isolated elements having a first set of inner edges. The method includes the further step of providing on the substrate a series of wall structures for forming one or more cavities there between. The wall structures have a second set of inner edges cooperating with the first set of inner edges. Furthermore, the second set of inner edges is positioned outside the first set of inner edges with respect to a center of the cavity formed by a first inner edges and the second inner edges by a pre-defined distance. The method disclosed herein includes the further step of depositing a liquid material in the cavities.

Laterally shifting the features of the wall structures with respect to the features of the isolated elements, like respective edges of the isolated elements, provides an advantageous geometry for drying of a liquid material. It is found that when respective edges of the wall structures define a slightly broader cavity than would have been defined by the edges of the isolated materials a substantially homogeneous semiconductor layer is provided. Therefore, in particular embodiments, respective edges of the wall structure are positioned outside the edges of the isolated elements by a distance of 1 to 20 micrometers, more specifically by a distance of 1 to 10 micrometers, yet more particularly by a distance of 1 to 5 micrometers, and even more particularly by a distance of 1-3 micrometers. It will be appreciated that the term "positioned outside" is defined in a direction outwardly from a center of a cavity. This feature will be discussed in further detail with reference to FIGS. 1a-1d.

A semiconductor device is also described wherein the device includes a substrate having a layer of conducting material comprising a set of isolated elements having a first set of inner edges. The isolated elements also include wall structures having a second set of inner edges cooperating with the first set of inner edges. The second set of inner edges is positioned outside the first set of inner edges with respect to a cavity formed by the first inner edges and the second inner edges by a pre-defined distance.

The invention further relates to a display and an electronic apparatus including the above-described semiconductor device.

These and other aspects of the invention will be further discussed with reference to drawings wherein like reference signs represent like elements. It will be appreciated that the drawings are presented for illustrative purposes only and may not limit the scope of the appended claims.

BRIEF DESCRIPTION OF THE DRAWINGS

While the claims set forth the features of the present invention with particularity, the invention, together with its objects and advantages, may be best understood from the following detailed description taken in conjunction with the accompanying drawing of which:

DETAILED DESCRIPTION OF THE DRAWINGS

Figure 1A:
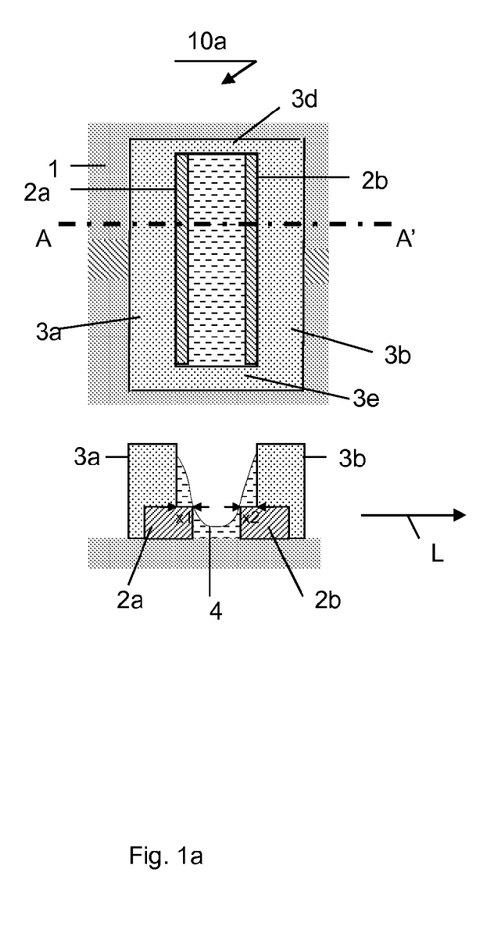
FIGS. 1a-1d provide schematic views of respective exemplary embodiments of a lateral displacement between edges of the wall structures and edges of the isolated elements.

FIGS. 1a-1d provide schematic views of respective exemplary embodiments of a semiconductor device, depicting a lateral displacement between edges of the wall structures and edges of the isolated elements. An embodiment, schematically shown in FIG. 1a, depicts a top view (above) and a cross-section taken along the line A-A' (below) of a semiconductor structure 10a according to an exemplary embodiment.

The semiconductor structure 10a comprises a substrate 1 on top of which a metal layer may be arranged, which is subsequently patterned into a suitable plurality of laterally isolated elements 2a, 2b. For simplicity reasons only two isolated elements are shown. In addition, on the substrate 1a set of wall structures 3a, 3b are arranged so that a cavity is formed there between. In accordance with the exemplary embodiment the inner edges of the wall structures are outwardly displaced in a lateral direction L, with respect to the inner edges of the isolated elements with which they cooperate, by a pre-determined distance x1, x2. The predetermined distance is selected in a range of 1 to 20 micrometers, and more particularly in a range of 1 to 10 micrometers, yet more particularly in a range of 1 to 5 micrometers, and even more particularly in a range of 1-3 micrometers. It will be appreciated that the distance x1 may or may not be equal to the distance x2.

When the wall structures may be suitably formed, for example, by means of a lithography process by exposing a suitable resist from the top through a suitable photo-mask. The resulting cavities between the thus formed wall structures are filled with a suitable liquid material 4. Either a semiconductor material, or a precursor material is selected for the liquid material.

The wall structures 3a, 3b are joined together by respective regions 3d, 3e at a periphery of the semiconductor device 10a thereby forming a closed structure. The embodiment shown in FIG. 1a relates to a configuration wherein a single channel semiconductor device, for example, a TFT is provided.

Figure 1B:
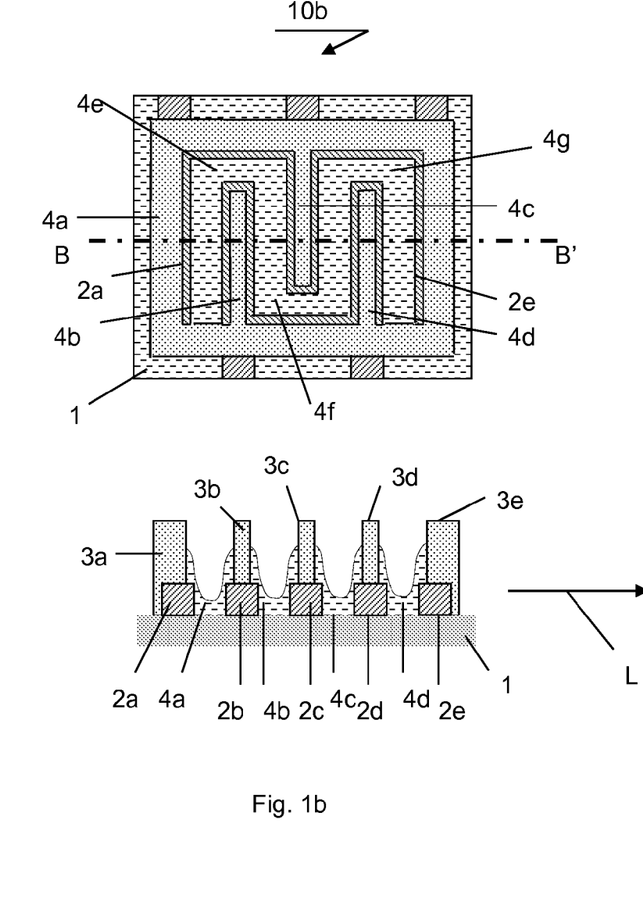

FIG. 1b presents a schematic view of an embodiment of a semiconductor device 10b, according to illustrative embodiments, wherein a plurality of interconnected cavities are provided. Likewise, the upper view relates to a top view on the semiconductor device 10b while the lower view relates to a cross-section taken along the line B-B'.

A substrate 1 includes a set of elements 2a, 2b, 2c, 2d, and 2e, isolated in a lateral direction L, and a set of wall structures 3a, 3b, 3c, 3d, and 3e cooperating with the set of elements 2a, 2b, 2c, 2d, and 2e so that inner edges of the wall structures 3a, 3b, 3c, 3d, and 3e are laterally outwardly displaced with respect to the inner edges of the elements 2a, 2b, 2c, 2d, and 2e. It will be appreciated that in order to provide a snake-like shape for the integral cavity (shown in the top view), the individual cavities 4a, 4b, 4c, and 4d are interconnected by regions 4e, 4f, and 4g shown in the top view.

Figure 1C:
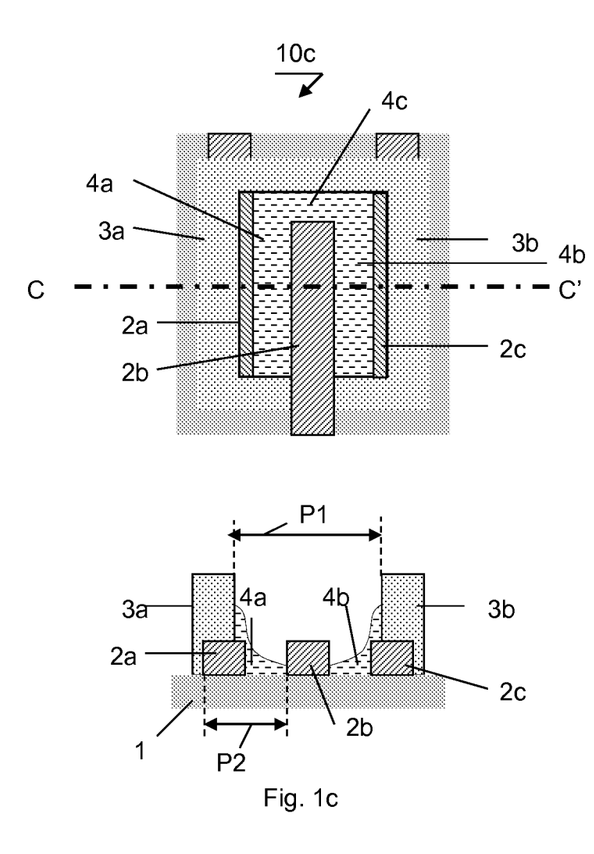

FIG. 1c schematically presents a further embodiment of the semiconductor device 10c according to illustrative embodiments wherein a pitch of the isolated elements is not equal to a pitch of the wall structures. Also in FIG. 1c the upper view relates to a top view on the semiconductor device 10c while the lower view relates to a cross-section taken along a line C-C'. The substrate 1 is provided with a set of isolated elements 2a, 2b, 2c whereby a cavity is defined by the wall structures 3a, 3b, said cavity being larger, for example being about twice as large as a distance between adjacent elements 2a, 2b. The pitch P2 of the wall structures is, therefore, not equal to the pitch P1 of the elements 2a, 2b, 2c. In accordance with exemplary embodiments, respective inner edges of the wall structures 3a, 3b cooperating with inner edges of the elements 2a, 2c are outwardly displaced in a lateral direction L from the inner edges of the elements 2a, 2c. The cavity is then filled by the semiconductor material 4a, 4b. Also in this embodiment regions 4a, 4b of the semiconductor are joined together by a bridge 4c, shown in the upper view.

Figure 1D:
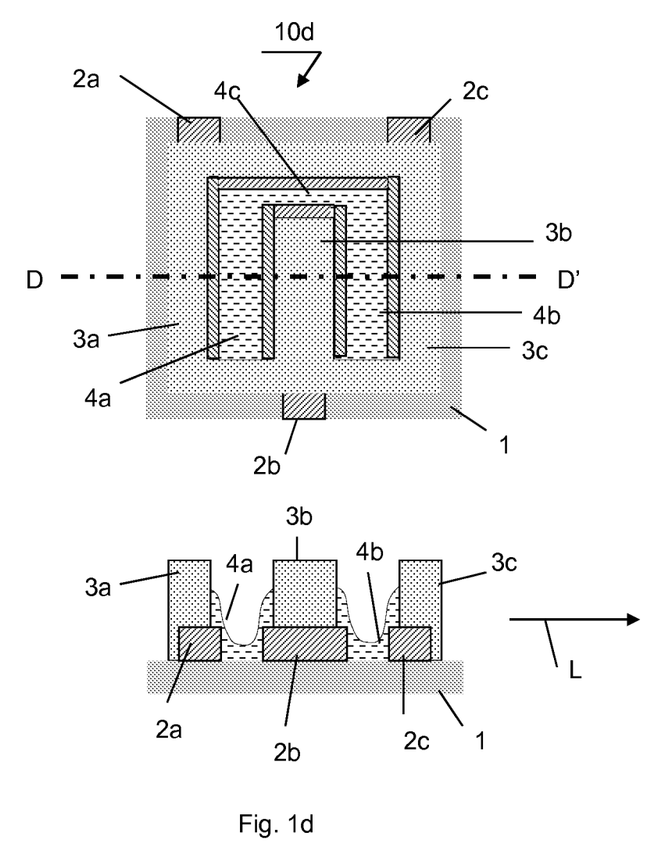

A still further embodiment of a semiconductor device 10d is schematically depicted in FIG. 1d. The upper view relates to a top view on the semiconductor structure while the lower view relates to a cross-section taken along the line D-D'. This exemplary embodiment, like embodiments shown in FIGS. 1b and 1c, relates to a multiple channel semiconductor structure, for example a TFT. The channels 4a and 4b are interconnected by a bridge 4c. In this particular embodiment a dimension of the elements 2b in the lateral direction L is different, for example larger than respective dimensions of the elements 2a and 2c. The other features of the structure 10d are substantially the same as discussed with reference to FIG. 1b.

Figure 2:
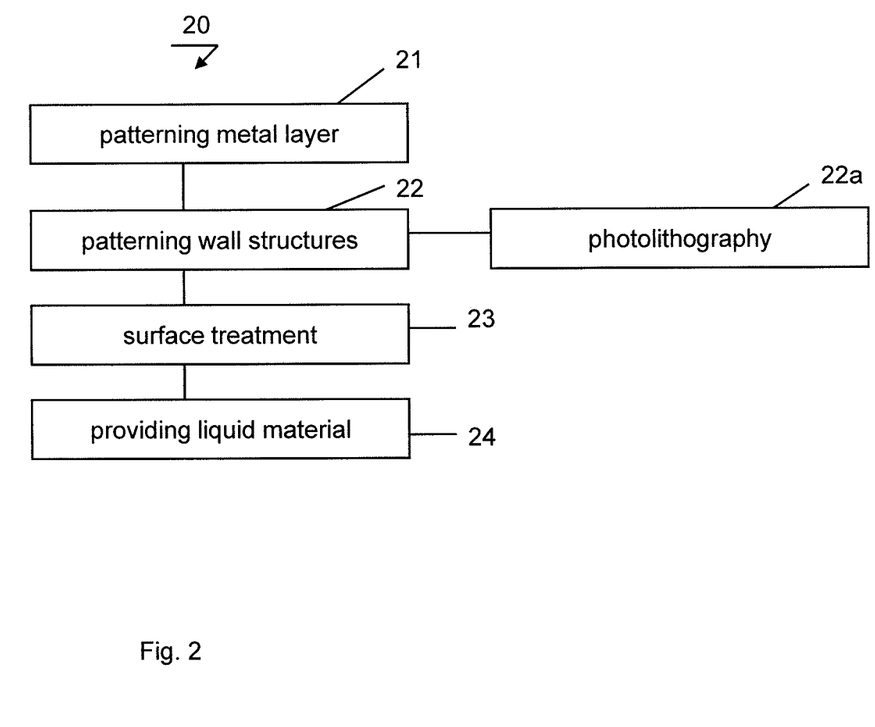
FIG. 2 schematically presents an embodiment of the method according to the invention.

FIG. 2 schematically presents an embodiment of the method according to exemplary embodiments. In accordance with method 20, a suitable metal layer is first deposited on a substrate. Subsequently, at step 21 the metal layer is patterned for obtaining a set of isolated elements. It will be appreciated that the term isolated elements relates to a configuration wherein individual elements may be identified along a lateral direction on the substrate, as is schematically shown in any of the FIGS. 1a-1d. The elements are interconnected at a peripheral region by a lateral bridge thereby at least partially confining respective cavities.

At step 22 the wall structures are patterned adjacent the laterally isolated elements of a metal layer. The metal layer relates, for example, to a source-drain layer of a semiconductor device, in particular, of a TFT device. The wall structures comprise a second set of edges cooperating with a first set of edges of the isolated elements, the second set of edges are laterally outwardly displaced with respect to the first set of edges. Accordingly, a layer of a conducting material provided on a substrate in a pattern and comprising isolated elements having a first set of inner edges is created which is arranged to cooperate with a series of wall structures arranged for forming one or more cavities there between. The wall structures have a second set of inner edges cooperating with the first set of inner edges, wherein the second set of inner edges is positioned outside the first set of inner edges with respect to a center of the cavity formed by first inner edges and second inner edges by a pre-defined distance. Accordingly, the first inner edges are preceding the second inner edges with respect to a cavity boundary.

It is possible to use a plurality of suitable deposition and/or patterning techniques for providing the wall structures on the substrate. For example, spin-coating followed by photolithography and/or etching may be used. The wall structures are provided either with straight or with curved side walls. These embodiments are discussed in further detail with reference to FIG. 3.

At step 23 surfaces of the wall structures and/or surfaces of the underlying layers conceived to come into contact with a liquid material which at least partially fills the thus provided cavities, are treated for modifying wettability properties of such surfaces. In particular wettability properties regarding water or a solvent are modified. Preferably, the surfaces of the wall structures, like surfaces facing the cavity and/or top surfaces are hydrophobic and/or solvophobic.

At step 24 the cavities are filled with a suitable liquid material, which relate to a semiconductor or a precursor material. Optionally this step is followed by deposition of one or several dielectric, semiconducting or metal layers. The semiconductor layer comprises a soluble or dispersible organic or inorganic material. Optionally a variety of additives are provided such as, for example, binders and/or surfactants.

Figure 3:
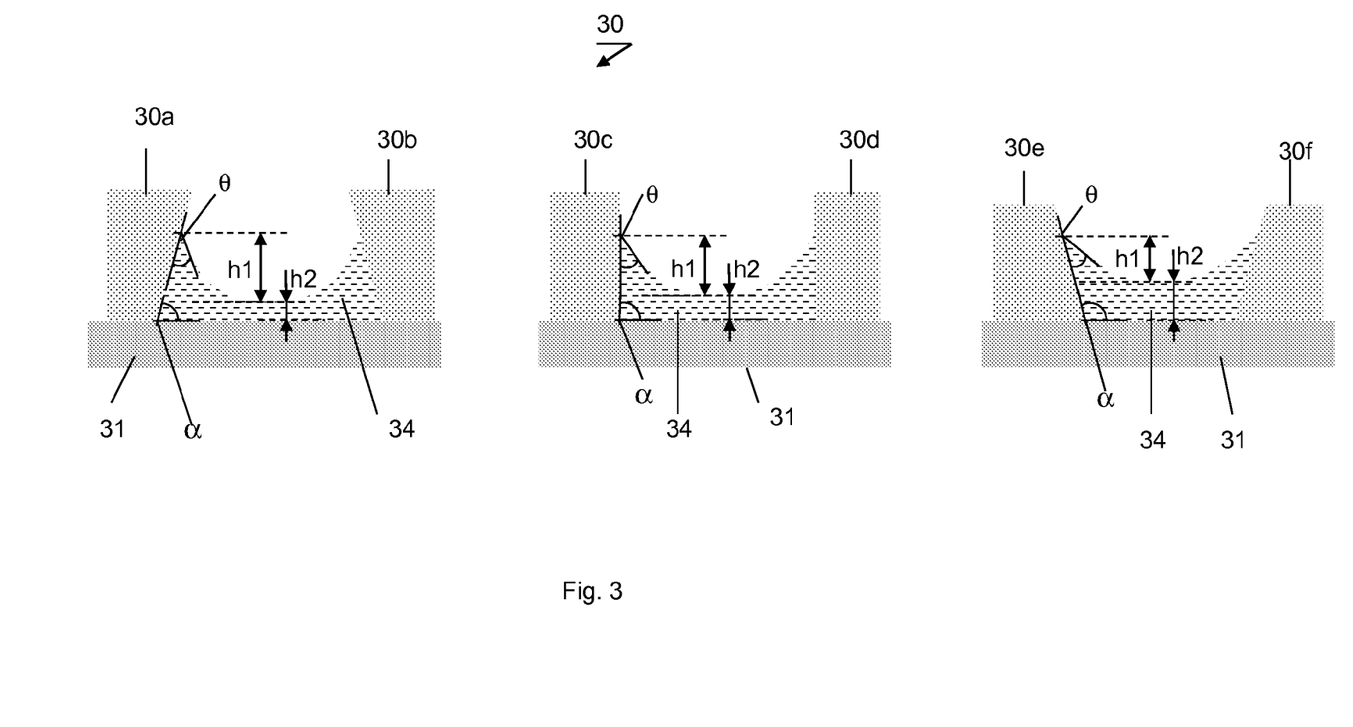
FIG. 3 schematically presents exemplary embodiments of wall structures.

FIG. 3 schematically presents exemplary embodiments 30 of wall structures. For simplicity reasons, isolated elements of a metal layer shown in FIGS. 1a-1d are not depicted. In a first exemplary embodiment a substrate 31 is provided with wall structures 30a, 30b having side walls inclined towards the center of the cavity. It is found that, for a constant contact angle $\theta$ an inclination angle $\alpha$ may influence the height of a meniscus of the liquid material 34 deposited in the cavity. The angle $\alpha$ may have a positive influence on relative relation between a height of the liquid h1+h2 near the wall structure and a height of the liquid h2 in the center of the cavity. It is advantageous when the height h1 is minimized. By increasing the angle $\alpha$, the homogeneity of a height profile of the liquid material 34 in the cavity is improved as h2 increases and h1 tends to zero. It is noted that h1 schematically indicates a difference between the liquid height at the edge and at the center of the cavity.

For example, it is found that for substantially vertically arranged side walls of the wall structures 30c, 30d a value of h2 increases with respect to a value of h2 for side walls 30a, 30b. By further increasing a slope of the side walls with respect to the substrate yielding outwardly oriented side walls 30e, 30f a value of h2 still further increases and h1 tends to zero. As a result a substantially homogeneous height profile of a semiconductor material in the cavity is ensured.

Figure 4:
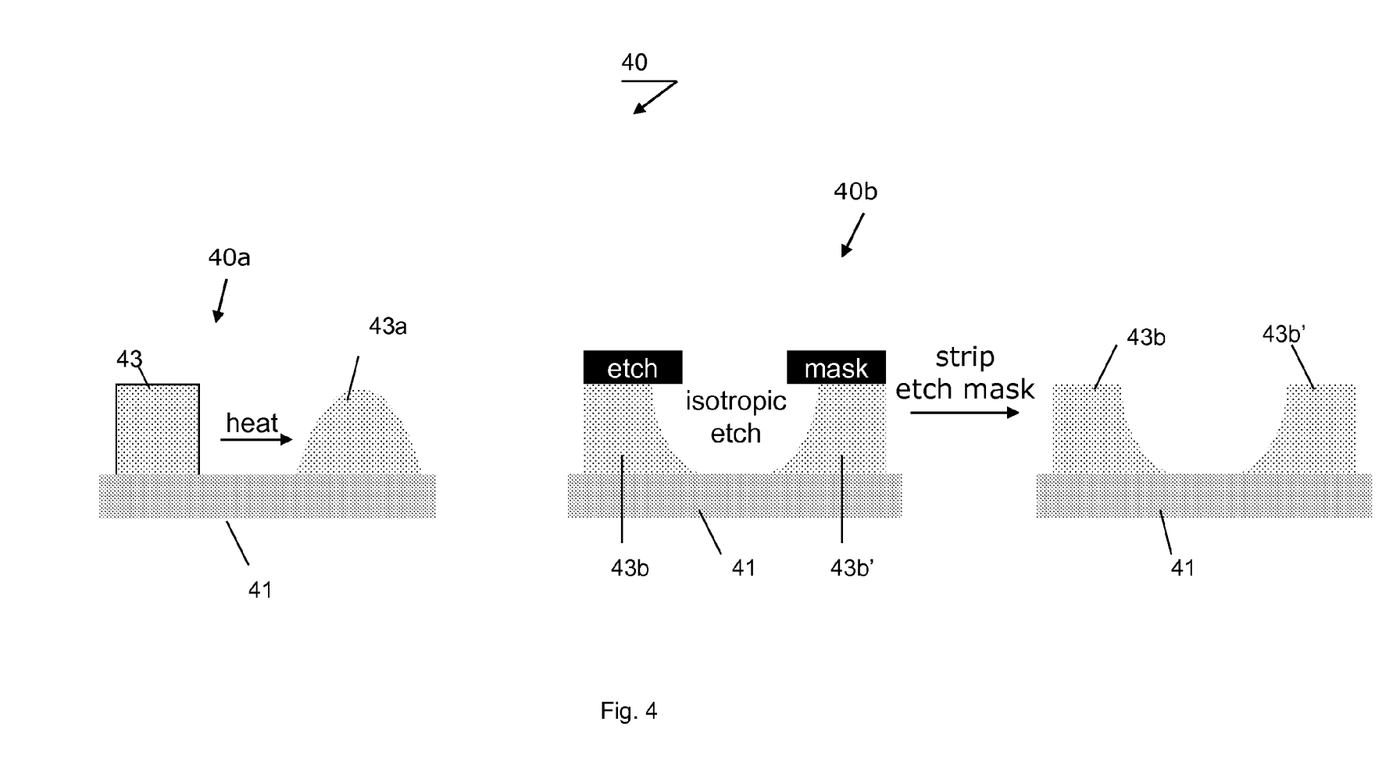
FIG. 4 schematically presents an embodiment of methods for manufacturing curved wall structures.

FIG. 4 presents, in a schematic way, embodiments of a method for manufacturing curved wall structures. In a method 40a, a substantially rectangular side wall 43, for example comprising a thermoplastic or wax material arranged on a substrate 41, may be heated yielding a structure 43a with a convex wall profile.

Alternatively, in method 40b, a bulk wall structure provided on a substrate 41 may be isotropically etched to yield two wall structures 43b, 43b' having a concave wall profile. Subsequently, the mask used for etching process is stripped leaving the concave wall structures 43b, 43b' on the substrate 41. It will be appreciated that for simplicity reasons the isolated elements discussed with reference to FIGS. 1a-1d are not shown.

Figure 5:
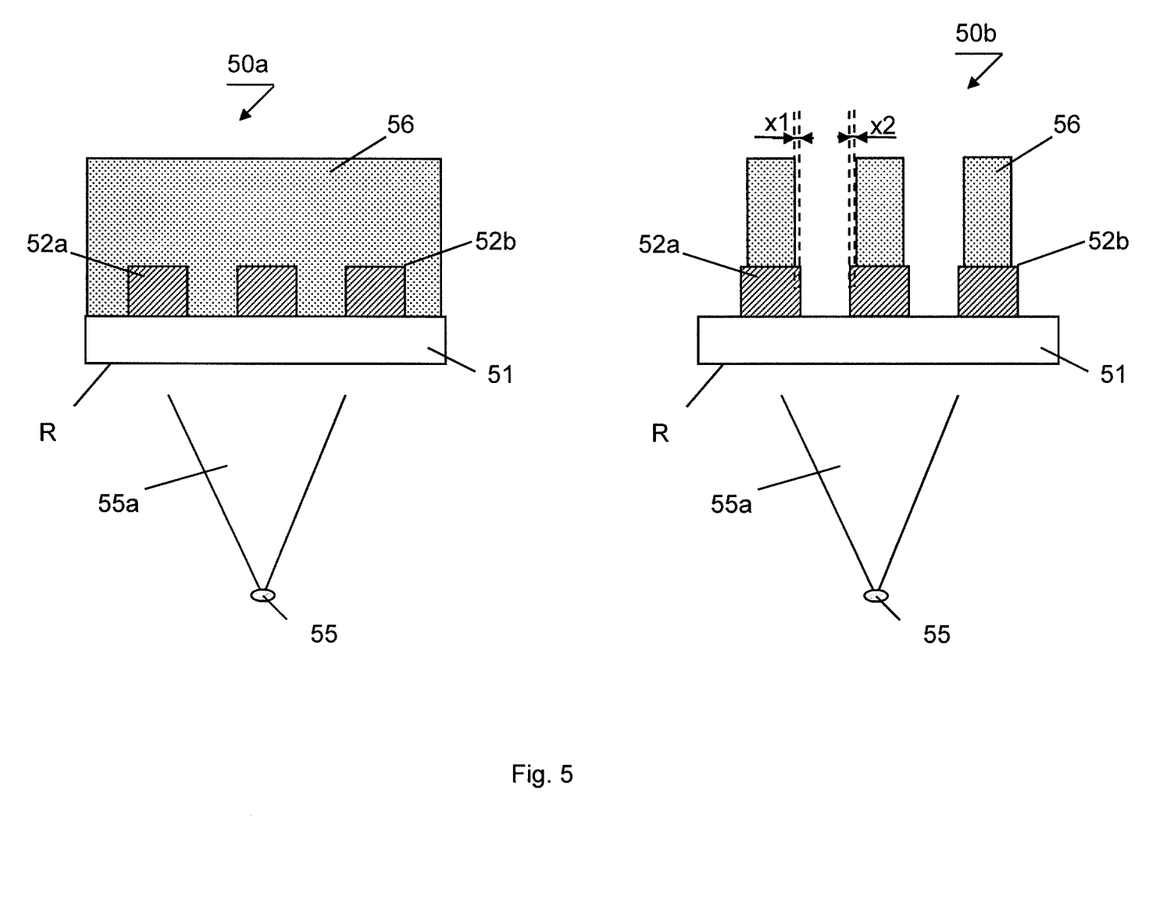
FIG. 5 schematically presents an embodiment of a method for patterning wall structures using photolithography.

FIG. 5 schematically presents an embodiment of a method for patterning wall structures using photolithography. In this embodiment, view 50a shows a substrate 51 being lithographically processed from a rear surface R using a beam of radiation 55a emanating from a suitable source 55 of a lithographic apparatus (not shown). In this arrangement the isolated elements 52a, 52b of the metal layer are used as mask features for patterning suitable wall structures in a photosensitive material 56, which is arranged as a bulk layer atop the isolated elements 52a, 52b. By varying the exposure and developing conditions for material of the wall structures 56, desired wall profiles are obtained, see view 50b indicating a post-exposure condition. For example, by overexposing and/or overdeveloping a positive-type photoresist material it is possible to create a wall structure with edges that are set back by the distances x1 and x2 from the edges of the conducting pattern. Similarly, by adjusting the lithography and/or material parameters it is possible to create a wall structure with slanted or curved sidewalls.

Figure 6:
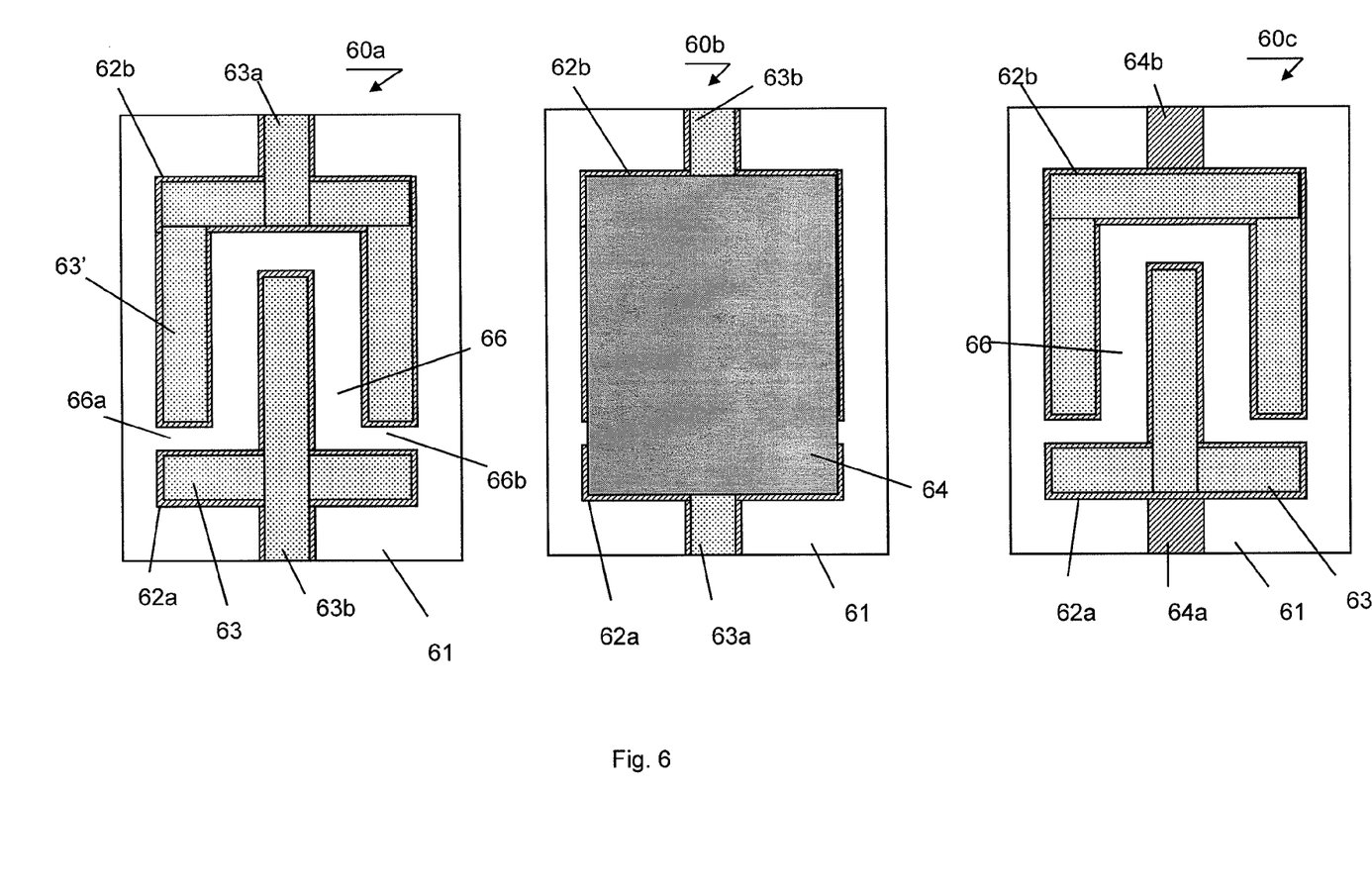
FIG. 6 schematically presents a top view of an embodiment shown in FIG. 5 demonstrating a further exemplary embodiment of the method according to the invention.

FIG. 6 schematically presents a top view of an embodiment shown in FIG. 5 demonstrating a further embodiment of the method generally disclosed herein. In view 60a, a substrate 61 is shown (corresponding to the substrate 51 shown in FIG. 5), whereon a cavity 66 is formed by a layer comprising isolated elements 62a, 62b cooperating with wall structures 63, 63'. Preferably, areas 66a, 66b of the cavity are kept minimal to avoid leakage of the fluid there through. A layer from which the wall structures are formed may comprise superfluous regions 63a, 63b. In order to remove these regions, the layer is frontally exposed during a suitable lithographic step.

View 60b schematically shows a photomask pattern 64 overlaid on the wall layer, leaving superfluous area 63a, 63b uncovered. View 60b shows results of a frontal lithography step through the photomask pattern 64 wherein electrode areas 64a, 64b are revealed.

It will be appreciated that while specific exemplary embodiments of the invention have been described above, that the invention may be practiced otherwise than as described. Figures are provided for illustrative purposes and may not be used for limiting the scope of the invention as is set forth in the appended claims. In addition, isolated features discussed with reference to different figures may be combined.

What is claimed is:

1. A method of manufacturing a semiconductor device, comprising the steps of:
   providing, on a substrate, a layer of an electrically conducting material in a pattern comprising isolated elements having a first set of inner edges;
   providing on the isolated element, a series of wall structures for forming one or more cavities there between, said wall structures having a second set of inner edges cooperating with said first set of inner edges, wherein the second set of inner edges is positioned outside the first set of inner edges with respect to a center of the cavity formed by a first inner edges and the second inner edges by a pre-defined distance, wherein the wall structures are patterned by back-photolithography, wherein the isolated elements are used as a mask, and wherein the substrate is substantially transparent to a wavelength of a radiation used for the back-photolithography; and
   depositing a liquid material in said one or more cavities.

2. The method according to claim 1, wherein said predetermined distance is in the range of 1 to 20 micrometers.

3. The method according to claim 1, wherein the isolated elements are arranged with a first pitch, the wall structures are arranged with a second pitch, the first pitch being not equal to the second pitch.

4. The method according to claim 1, further comprising the step of: modifying surface properties of a surface of the wall structures for modifying wettability of said surfaces with respect to water or a solvent.

5. The method according to claim 4, wherein the surface comprises a surface facing the cavity and/or a top surface of the wall structure.

6. The method according to claim 1, wherein the wall structures are provided with substantially vertical, angled or curved walls.

7. The method according to claim 1, wherein the liquid material comprises at least a solvent and a semiconductor material or a precursor of a semiconductor material.

8. The method according to claim 1, wherein the liquid material comprises at least a dispersing medium and dispersed particles of a semiconductor material or a precursor of a semiconductor material.

9. The method according to claim 7, wherein for the semiconductor material an organic semiconductor material is selected.

10. The method according to claim 7, wherein for the semiconductor material an inorganic semiconductor material is selected.

11. The method according to claim 1, further comprising a front-side photolithographic step for removing superfluous portions of a layer forming wall structures.

* * * * *